United States Patent
Wang et al.

(10) Patent No.: US 9,543,949 B2
(45) Date of Patent: Jan. 10, 2017

(54) DIFFERENTIAL SIGNAL REVERSION AND CORRECTION CIRCUIT AND METHOD THEREOF

(71) Applicant: INSPUR ELECTRONIC INFORMATION INDUSTRY CO., LTD, Jinan, Shandong Province (CN)

(72) Inventors: Endong Wang, Jinan (CN); Leijun Hu, Jinan (CN); Rengang Li, Jinan (CN)

(73) Assignee: INSPUR ELECTRONIC INFORMATION INDUSTRY CO., LTD, Shangdong (CN)

( * ) Notice: Subject to any disclaimer, the term of this patent is extended or adjusted under 35 U.S.C. 154(b) by 0 days.

(21) Appl. No.: 14/627,391

(22) Filed: Feb. 20, 2015

(65) Prior Publication Data
US 2015/0193307 A1    Jul. 9, 2015

Related U.S. Application Data

(63) Continuation of application No. PCT/CN2014/071478, filed on Jan. 26, 2014.

(30) Foreign Application Priority Data

Jan. 24, 2014 (CN) .......................... 2014 1 0009245

(51) Int. Cl.
*H04L 1/00*    (2006.01)
*H03K 19/00*    (2006.01)
(52) U.S. Cl.
CPC .................................... *H03K 19/00* (2013.01)
(58) Field of Classification Search
CPC .................................................... H04L 1/0057
(Continued)

(56) References Cited

U.S. PATENT DOCUMENTS 3,618,022 A * 11/1971 Isaacs .................. H05B 37/029
                                                   340/3.43
4,347,600 A *  8/1982 Abbott ...................... H04J 3/14
                                                   370/225
(Continued)

FOREIGN PATENT DOCUMENTS

| CN | 101567729 | 10/2009 |
| CN | 102142987 | 8/2011  |
| CN | 102969015 | 3/2013  |

OTHER PUBLICATIONS

International Search Report for application No. PCT/CN2014/07478 dated Sep. 11, 2014 (5 pages total).
(Continued)

*Primary Examiner* — Fritz Alphonse
(74) *Attorney, Agent, or Firm* — Hamre, Schumann, Mueller & Larson, P.C

(57) ABSTRACT

A differential signal reversion and correction circuit and a method thereof are provided. The structures of the circuit include: a data frame sending module, when the link conditions are detected, the data frame sending module generates specific logic sequence and finishes the sending by a input/output port, such that a receiving side receives, processes and analyzes the sequence, and determination of link transmission conditions are achieved; a comparator of the receiving side, which receives sequence data, performs corresponding comparing, checking and feedback controlling, thereby achieving link detection and differential correction purpose; a reversion control signal generating module, which receives a comparison result of the comparator, generates corresponding control signal, and controls the link whether to perform reversion operation.

5 Claims, 2 Drawing Sheets

(58) Field of Classification Search
USPC .............................. 714/776, 747, 824, 712
See application file for complete search history.

(56) References Cited

U.S. PATENT DOCUMENTS

| | | | |
|---|---|---|---|
| 2003/0063240 A1* | 4/2003 | Takizawa | G02F 1/133514 349/106 |
| 2003/0160244 A1* | 8/2003 | Amano | H01L 27/12 257/72 |
| 2009/0177457 A1 | 7/2009 | Dai et al. | |

OTHER PUBLICATIONS

Written Opinion of the International Search Authority for application No. PCT/CN2014/07478 dated Sep. 11, 2014 and English language translation thereof (11 pages total).

* cited by examiner

DIFFERENTIAL SIGNAL REVERSION AND CORRECTION CIRCUIT AND METHOD THEREOF

FIELD

The disclosure herein relates to communication information technology field, particularly to a differential signal reversion and correction circuit and a method thereof.

BACKGROUND

With the high development of computer technology and integrated circuit technology, high performance computer system has increasingly become a development need of an economic society. This brings huge challenge to the design difficulty of the computer system, such as for example, data transmission rate of the system interconnection and data transmission bandwidth all reach an unprecedentedly level. Where the system interconnection includes chips, boards and systems. Currently, transmission frequency among key chip groups of the computer system reaches nearly 10 GHz, data transmission bandwidth reaches dozens GB/s, high speed signal transmission rate reaches about 10 Gbps, and high speed signal transmission bandwidth also reaches dozens channels. The high speed signal adopts differential signal to transmit, which exacerbates a huge amount of signal lines and brings huge challenge to chip design, PCB design and system design. For example, the bandwidth of QPI interface serial data signal reaches 20 channels, and each channel adopts differential signal to transmit. Therefore, this brings huge problem to differential high speed transmission design of serial data multi-channel among chips. On the one hand, high bits wide serial data differential signal brings challenge to PCB design of the system, and due to the signal quality requirement, multi-channel signal cannot be strictly sorted and wired. On the other hand, in multiprocessor system, one motherboard can be integrated with multiple processors or other chip groups, resulting in that multi-channel high speed port cannot be sorted and wired, some of the ports have to be staggered, and even the differential signal reverse to be wired. The aforementioned challenges bring great complexity for PCB design and chips design and verification, and seriously affect the design and verification period of the system. Therefore, design a differential signal reversion and correction circuit inside the chip can effectively solve the problem.

SUMMARY

The disclosure herein is to solve the deficiencies of the prior art, and to provide a differential signal reversion and correction circuit and a method thereof One embodiment of the disclosure herein can be implemented in the following manners. A differential signal reversion and correction circuit, includes the following modules disposed between two interconnected nodes:

a data frame sending module, including a first input port, a second input and output port and a third input and output port. The input port is connected to a P line and a N line through a first buffer. The second input and output port and the third input and output port are connected to each other in parallel and then are connected to the P line and the N line respectively;

a reversion control signal generating module, including a second buffer connected to the P line and the N line, a comparator connected in series to the second buffer, and a control link. The control link includes: an uplink, i.e. a first control switch, where the input side of the first control switch is disposed at a configuring module which is positioned between the buffer and the comparator, the first control switch is connected in series to the configuring module, and the output side of the first control switch is connected to the P line and the N line respectively; a downlink, i.e. a second control switch, where the input side of the second control switch is disposed between the buffer and the comparator and the output side of the second control switch is connected to the P line and the N line respectively.

Some embodiments of the disclosure herein provide a method of differential signal reversion and correction. The operating process of the method includes:

when a link goes into a mode of link detection and reversion and correction, the data frame sending module generates corresponding logic sequence and finishes the sending. A receiving side receives the sequence data. The comparator compares and processes the received sequence, and forms corresponding feedback or check, thereby achieving link detection and differential correction purpose;

a comparing result from the comparator is notified to the reversion control signal generating module. The reversion control signal generating module generates corresponding control sequence which controls the correctness of the data receiving and controls whether the link performs reversion operation.

In some embodiments, the detailed operating process of the method includes:

the data frame sending module generates logic "1" sequence, and the second input and output port and the third input and output port send the sequence. In the receiving side, the configuring module controls the control switch to pull-down a signal, and in the meantime, the second input and output port and the third input and output port detect the pull-down result. If the detection result is logic "0", then it shows that the link is connected, otherwise the link is failed.

If the link is connected, the data frame sending module generates logic "1" or logic "0" sequence, and the first input port finishes sending the sequence.

In the receiving side, the comparator compares the received logic "1" sequence or logic "0" sequence with a high level and a low level. Where if the logic "1" sequence is sent, the sequence is compared with the high level. If the logic "0" sequence is sent, the sequence is compared with the low level.

If the logic "1" sequence is sent, the logic "1" sequence is compared with the high level in the receiving side. Where the comparison result shows that they are the same, the comparator outputs logic "0", no differential signal reversion occurs in the transmission link, and P-N is adopted for data recovery. Where the comparison result shows that they are different, the comparator outputs logic "1", notify the reversion control signal generating module, and control a data receiving module to reverse and control the link, i.e. N-P is adopted for data recovery.

Where the transmission link adopts multi-channel transmission, a control state machine controls the interconnection nodes to enter into a link detection and reversion correction mode. All the channels perform channel detection and reversion correction respectively. The channel that has not occurred reversion adopts P-N manner to recover data in the receiving side, and the channel that has occurred reversion adopts N-P manner to recover data in the receiving side.

As compared with the prior art, the embodiments of the disclosure herein have beneficial effects, including:

In some embodiments, the differential signal reversion and correction circuit and the method thereof fully consider the characteristics of the differential signal transmission link, and adopt a manner of detecting determination and automatic correction. This achieves the detection and control of high speed differential link differential signal reversion, in the meantime applies to multi-channel detection and correction in parallel, may effectively improve the efficiency of logic design verification, decreases the complexity of hardware debugging, makes up for difficulty and complexity of differential control performed manually. The differential signal reversion and correction circuit and the method thereof adopt automatic determination of transmission link connectivity and signal reversion, automatically form a control signal according to the determination situation, and control the correctness of the data receiving. The differential signal reversion and correction circuit and the method thereof can be applied widely, such as for example, applied in whether the logic design of FPGA chips or the logic design of ASIC chips, has strong practicability and are easy to promote.

BRIEF DESCRIPTION OF THE DRAWINGS

The drawings, which are not necessarily drawn to scale, illustrate generally by way of example, but not by way of limitation, various embodiments discussed in this application.

DETAILED DESCRIPTION OF THE EMBODIMENTS

Figure 1:
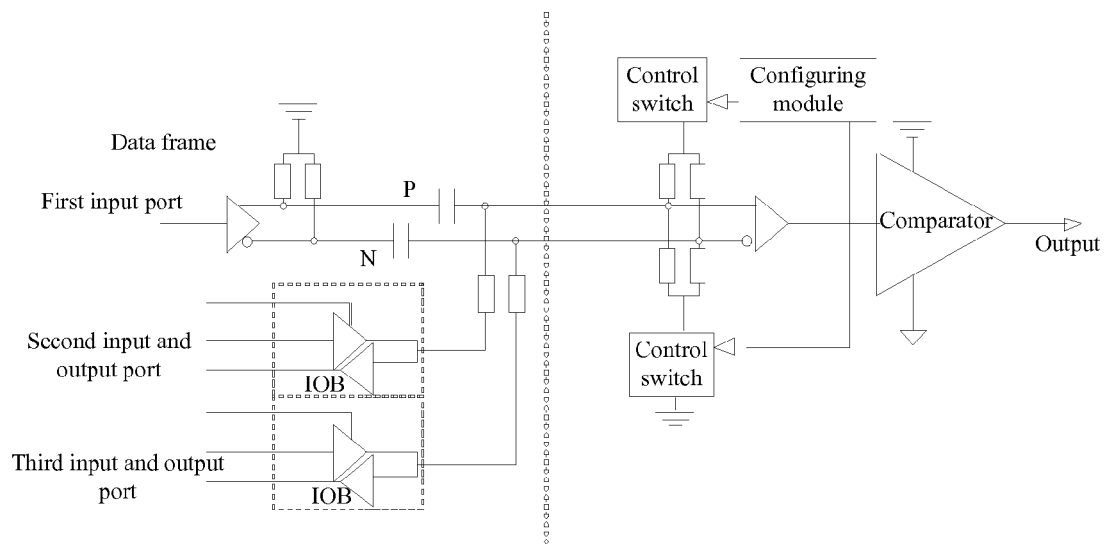
FIG. 1 illustrates a differential signal reversion correction circuit diagram in some embodiments.
Figure 2:
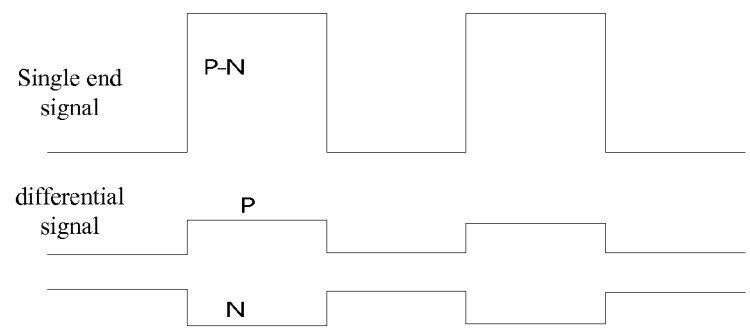
FIG. 2 illustrates a logic processing waveform inside the differential signal in some embodiments.
Figure 3:
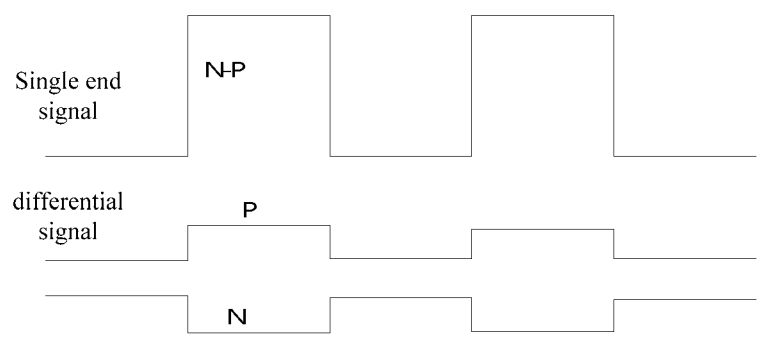
FIG. 3 illustrates a logic processing waveform inside the reversion signal of the differential signal in some embodiments.

The differential signal reversion and correction circuit and the method thereof of the disclosure herein will be explained below in detail referring to the drawings.

As shown in drawings 1, 2 and 3, the differential signal reversion and correction circuit provided by the disclosure herein, includes the following modules disposed between two interconnected nodes:

a data frame sending module, as shown by the left side of the dotted line in drawing 1, including a first input port, a second input and output port and a third input and output port. The input port is connected to a P line and a N line through a first buffer. The second input and output port and the third input and output port are connected to each other in parallel and then are connected to the P line and the N line respectively;

a reversion control signal generating module, as shown by the right side of the dotted line in drawing 1, including a second buffer connected to the P line and the N line, a comparator connected in series to the second buffer, and a control link. The control link includes: an uplink, i.e. a first control switch, where the input side of the first control switch is disposed at a configuring module which is positioned between the buffer and the comparator, the first control switch is connected in series to the configuring module, and the output side of the first control switch is connected to the P line and the N line respectively; a downlink, i.e. a second control switch, where the input side of the second control switch is disposed between the buffer and the comparator and the output side of the second control switch is connected to the P line and the N line respectively.

Some embodiments of the disclosure herein provide a method of differential signal reversion and correction. The operating process of the method includes:

when a link goes into a mode of link detection and reversion and correction, the data frame sending module generates corresponding logic sequence and finishes the sending. A receiving side receives the sequence data. The comparator compares and processes the received sequence, and forms corresponding feedback or check, thereby achieving link detection and differential correction purpose;

a comparing result from the comparator is notified to the reversion control signal generating module. The reversion control signal generating module generates corresponding control sequence which controls the correctness of the data receiving and controls whether the link performs reversion operation.

In some embodiments, the detailed operating process of the method includes:

the data frame sending module generates logic "1" sequence, and the second input and output port and the third input and output port send the sequence. In the receiving side, the configuring module controls the control switch to pull-down a signal, and in the meantime, the second input and output port and the third input and output port detect the pull-down result. If the detection result is logic "0", then it shows that the link is connected, otherwise the link is failed.

If the link is connected, the data frame sending module generates logic "1" or logic "0" sequence, and the first input port finishes sending the sequence.

In the receiving side, the comparator compares the received logic "1" sequence or logic "0" sequence with a high level and a low level. Where if the logic "1" sequence is sent, the sequence is compared with the high level. If the logic "0" sequence is sent, the sequence is compared with the low level.

If the logic "1" sequence is sent, the logic "1" sequence is compared with the high level in the receiving side. Where the comparison result shows that they are the same, the comparator outputs logic "0", no differential signal reversion occurs in the transmission link, and P-N is adopted for data recovery. Where the comparison result shows that they are different, the comparator outputs logic "1", notify the reversion control signal generating module, and control a data receiving module to reverse and control the link, i.e. N-P is adopted for data recovery.

Where the transmission link adopts multi-channel transmission, a control state machine controls the interconnection nodes to enter into a link detection and reversion correction mode. All the channels perform channel detection and reversion correction respectively. The channel that has not occurred reversion adopts P-N manner to recover data in the receiving side, and the channel that has occurred reversion adopts N-P manner to recover data in the receiving side.

In addition, in order to achieve automation operation, a state machine control module can be designed in the whole circuit, which is used to make the transmission link enter into a link detection and reversion correction mode in the link initialization phase. This is provided according to the link initialization characteristics of the interconnected nodes. The specific structures of the state machine control module have been discussed in the patent application with application No. CN201010593965.8 and title "serial bus device and method of transmitting data by the device". Thus, the disclosure herein does not discuss the same any more.

Some embodiments adopt a manner of detecting determination and automatic correction. This achieves the detection and control of link differential reversion for high speed differential link, in the meantime applies to multi-channel detection and correction in parallel, may effectively improve the efficiency of logic design verification, and decreases the complexity of hardware debugging.

The embodiments disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A differential signal reversion and correction circuit, comprising:
    two interconnected nodes; and
    a data frame sending module and a reversion control signal generating module disposed between the two interconnected nodes,
    the data frame sending module, including:
        a first input port, a second input port, a second output port, a third input port, and a third output port, the first input port is connected to a P line and an N line through a first buffer, the second input port, the second output port, the third input port, and the third output port are connected to each other in parallel and then are connected to the P line and the N line respectively; and
    the reversion control signal generating module, including:
        a second buffer connected to the P line and the N line,
        a comparator connected in series to the second buffer, and
        a control link, the control link including an uplink and a downlink, wherein
            the uplink is a first control switch, wherein an input of the first control switch is disposed at a configuring module which is positioned between the buffer and the comparator, the first control switch is connected in series to the configuring module, and an output of the first control switch is connected to the P line and the N line respectively, and
            the downlink is a second control switch, wherein an input of the second control switch is disposed between the buffer and the comparator, and an output of the second control switch is connected to the P line and the N line respectively.

2. A method of differential signal reversion and correction, comprising:
    when a link goes into a mode of link detection and reversion and correction:
        generating, by a data frame sending module, a corresponding logic sequence and finishing sending the corresponding logic sequence,
        receiving, by a receiving side, the corresponding logic sequence, and
        comparing, with a comparator, and processing the corresponding logic sequence received by the receiving side and performs corresponding feedback or checking, thereby achieving link detection and differential correction purpose;
    notifying a reversion control signal generating module of a comparing result from the comparator; and
    generating, by the reversion control signal generating module, a corresponding control signal which controls the correctness of data receiving and controls whether the link performs a reversion operation.

3. The method of claim 2, wherein when the link goes into a mode of link detection and reversion and correction further comprises:
    generating, by the data frame sending module, a logic "1" sequence;
    sending the sequence, by a second input port, a second output port, a third input port, and a third output port;
    in the receiving side, controlling, by a configuring module, a control switch to pull-down a signal;
    detecting a pull-down result by the second input port, the second output port, the third input port, and the third output port, wherein
        if the pull-down result is a logic "0", the link is connected, otherwise the link is failed; and
        if the link is connected, generating, by the data frame sending module, a logic "1" or logic "0" sequence, and
    sending the sequence by the first input port.

4. The method of claim 3, further comprising:
    in the receiving side, comparing, by the comparator, the received logic "1" sequence or logic "0" sequence with a high level and a low level, wherein if the logic "1" sequence is sent, the sequence is compared with the high level, and if the logic "0" sequence is sent, the sequence is compared with the low level; and
    if the logic "1" sequence is sent, comparing the logic "1" sequence with the high level in the receiving side, when the comparison result shows the logic "1" sequence and the high level are the same, outputting, by the comparator, logic "0" and no differential signal reversion occurs in the transmission link, and P-N is adopted for data recovery; when the comparison result shows the logic "1" sequence and the high level are different, outputting, by the comparator, logic "1", notifying the reversion control signal generating module, and controlling a data receiving module to reverse and control the link, and N-P is adopted for data recovery.

5. The method of claim 3, further comprising:
    when the transmission link adopts multi-channel transmission, controlling, by a control state machine, the interconnection nodes to enter into a link detection and reversion correction mode, wherein all the channels perform channel detection and reversion correction respectively, the channel that has not performed reversion adopts P-N manner to recover data in the receiving side, and the channel that has performed reversion adopts N-P manner to recover data in the receiving side.

* * * * *